(12) United States Patent
Jeloka et al.

(10) Patent No.: US 9,514,074 B2
(45) Date of Patent: *Dec. 6, 2016

(54) SINGLE CYCLE ARBITRATION WITHIN AN INTERCONNECT

(71) Applicant: The Regents of the University of Michigan, Ann Arbor, MI (US)

(72) Inventors: Supreet Jeloka, Ann Arbor, MI (US); Sandunmalee Nilmini Abeyratne, Ann Arbor, MI (US); Ronald George Dreslinski, Ann Arbor, MI (US); Reetuparna Das, Ann Arbor, MI (US); Trevor Nigel Mudge, Ann Arbor, MI (US); David Theodore Blaauw, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 654 days.

This patent is subject to a terminal disclaimer.

(21) Appl. No.: 13/940,915

(22) Filed: Jul. 12, 2013

(65) Prior Publication Data

US 2014/0019655 A1 Jan. 16, 2014

Related U.S. Application Data

(63) Continuation-in-part of application No. 13/438,920, filed on Apr. 4, 2012, now Pat. No. 8,868,817, which is
(Continued)

(51) Int. Cl.
*G06F 13/00* (2006.01)
*G06F 13/374* (2006.01)
(Continued)

(52) U.S. Cl.
CPC ......... *G06F 13/374* (2013.01); *G06F 13/4022* (2013.01); *G11C 7/10* (2013.01);
(Continued)

(58) Field of Classification Search
USPC .................................................. 710/305–317
See application file for complete search history.

(56) References Cited

U.S. PATENT DOCUMENTS 5,053,942 A 10/1991 Srini
5,230,152 A * 7/1993 Kennedy ................. B26B 5/001
30/162

(Continued)

FOREIGN PATENT DOCUMENTS

EP 0 744 879 11/1996
EP 10 894 61 4/2001
(Continued)

OTHER PUBLICATIONS

L. Zhang, "VirtualClock: A New Traffic Control Algorithm for Packet Switching Networks" *SIGCOMM Proceedings of the ACM Symposium on Communications Architectures & Protocols*, 1990, pp. 19-29.
(Continued)

*Primary Examiner* — Raymond Phan
(74) *Attorney, Agent, or Firm* — Nixon & Vanderhye P.C.

(57) ABSTRACT

An interconnect within an integrated circuit provides arbitration to select one of a plurality of signal inputs for connection to a signal output. The arbitration applied uses a first arbitration parameter value, in the form of a time stamp value, and, if two or more signal inputs share such a time stamp value, then uses a second arbitration parameter, in the form of a least recently granted value. The time increment applied to the time stamp value associated with each signal input when it is granted access to the signal output is
(Continued)

selected to reflect the quality of service to be associated with that signal input. When a comparison is made between time stamp values, the lowest time stamp value is given priority. A large time increment value corresponds to a low priority (quality of service).

20 Claims, 4 Drawing Sheets

Related U.S. Application Data a continuation-in-part of application No. 12/926,462, filed on Nov. 18, 2010, now Pat. No. 8,549,207, which is a continuation-in-part of application No. 12/458,511, filed on Jul. 14, 2009, now Pat. No. 8,230,152, which is a continuation-in-part of application No. 12/379,191, filed on Feb. 13, 2009, now Pat. No. 8,108,585.

(51) Int. Cl.
  G06F 13/40     (2006.01)
  G11C 7/10     (2006.01)
  H03K 17/693    (2006.01)

(52) U.S. Cl.
  CPC ......... *G11C 7/1012* (2013.01); *H03K 17/693* (2013.01); *G06F 2213/0038* (2013.01)

(56) References Cited

U.S. PATENT DOCUMENTS

| | | | |
|---|---|---|---|
| 5,517,186 A | 5/1996 | Veenstra |
| 5,530,814 A | 6/1996 | Wong et al. |
| 5,689,644 A | 11/1997 | Chou et al. |
| 5,781,717 A | 7/1998 | Wu et al. |
| 5,857,111 A | 1/1999 | Oda |
| 5,896,516 A | 4/1999 | Powell et al. |
| 5,991,296 A | 11/1999 | Mu et al. |
| 6,125,429 A | 9/2000 | Goodwin et al. |
| 6,356,111 B1 | 3/2002 | Moss |
| 6,690,597 B1 | 2/2004 | Perlov et al. |
| 6,715,023 B1 | 3/2004 | Abu-Lebdeh et al. |
| 6,771,162 B1 | 8/2004 | Moss |
| 6,801,978 B2 | 10/2004 | Sota |
| 6,950,893 B2 | 9/2005 | Chan |
| 7,020,131 B1 | 3/2006 | Yun et al. |
| 7,161,906 B2 | 1/2007 | Dell et al. |
| 7,178,005 B1 | 2/2007 | Jordan et al. |
| 7,239,669 B2 | 7/2007 | Cummings et al. |
| 7,424,013 B1 | 9/2008 | Yun et al. |
| 7,643,493 B1 | 1/2010 | Sayrafian-Pour |
| 7,657,693 B2 | 2/2010 | Singh et al. |
| 7,907,625 B1 | 3/2011 | MacAdam |
| 8,108,585 B2 * | 1/2012 | Satpathy ............ G06F 13/4022 340/2.1 |
| 8,155,134 B2 | 4/2012 | Fairhurst et al. |
| 8,230,152 B2 | 7/2012 | Satpathy et al. |
| 8,255,610 B2 | 8/2012 | Satpathy et al. |
| 8,549,207 B2 * | 10/2013 | Satpathy ................. G11C 7/10 340/14.4 |
| 8,868,817 B2 * | 10/2014 | Satpathy ................. G11C 7/10 710/317 |
| 2003/0221043 A1 | 11/2003 | Sota |
| 2004/0047334 A1 | 3/2004 | Francois et al. |
| 2004/0062238 A1 | 4/2004 | Yoshizawa et al. |
| 2004/0083326 A1 | 4/2004 | Wang et al. |
| 2004/0120337 A1 | 6/2004 | Jun et al. |
| 2005/0097256 A1 | 5/2005 | Jones |
| 2006/0031625 A1 | 2/2006 | Chan |
| 2008/0186961 A1 | 8/2008 | Yun et al. |
| 2009/0034517 A1 | 2/2009 | Yang et al. |
| 2009/0089478 A1 | 4/2009 | Singh et al. |
| 2010/0090189 A1 | 4/2010 | Savransky |
| 2010/0211719 A1 | 8/2010 | Satpathy et al. |
| 2011/0138098 A1 | 6/2011 | Satpathy et al. |
| 2011/0181307 A1 | 7/2011 | Kuekes |
| 2012/0254491 A1 | 10/2012 | Satpathy et al. |

FOREIGN PATENT DOCUMENTS

| | | |
|---|---|---|
| EP | 11 152 30 | 7/2001 |
| GA | 22 611 31 | 5/1993 |
| GB | 2 261 131 | 10/1991 |
| JP | 2000/022728 | 1/2000 |
| JP | 2000-22728 | 1/2000 |
| JP | 2001/197068 | 7/2001 |
| JP | 2002-342306 | 11/2002 |
| JP | 2004-78713 | 3/2004 |
| JP | 2008-46997 | 2/2008 |
| WO | WO 99/35879 | 7/1999 |
| WO | WO 2004/049645 | 6/2004 |
| WO | WO2005/020066 | 3/2005 |

OTHER PUBLICATIONS

S. Satpathy et al, "A 4.5Tb/s 3.4 Tb/s/W 64×64 Switch Fabric With Self-Updating Least-Recently-Granted Priority and Quality-of-Service Arbitration in 45 nm CMOS" *International Solid State Circuits Conference*, 2012, 2 pages.
B. Grot et al, "Preemptive Virtual Clock: A Flexible, Efficient, and Cost-effective QOS Scheme for Networks-on-Chip" *MICRO '09* Proceedings 42$^{nd}$ Annual IEEE/ACM Int. Symp. Microarchit., 2009, 12 pages.
K.H. Yum et al, "Investigating QoS Support for Traffic Mixes with the MediaWorm Router" *High-Performance Computer Architecture*, 2000, 10 pages.
A.A. Chien et al, "Approaches to Quality of Service in High-Performance Networks" *Proceedings of the Parallel Computer Routing and Communications Workshop*, Jul. 1997, 17 pages.
J.W. Lee et al, "Globally-Synchronized Frames for Guaranteed Quality-of-Service in On-Chip Networks" *35$^{th}$ IEEE/ACM International Symposium on Computer Architecture (ISCA)*, Jun. 2008, 12 pages.
U.S. Appl. No. 13/137,487, filed Aug. 19, 2011, Satpathy et al.
U.S. Appl. No. 12/926,462, filed Nov. 18, 2010, Satpathy et al.
U.S. Appl. No. 12/458,511, filed Aug. 14, 2009, Satpathy et al.
U.S. Appl. No. 12/379,191, filed Feb. 13, 2009, Satpathy et al.
Golshan et al., "A novel reduced swing CMOS BUS interface circuit for high speed low power VLSI systems", *IEEE Explore*, Jan. 22, 2009, pp. 351-354.
Chang et al., "A 50 Gb/s 32×32 CMOS Crossbar Chip using Asymmetric Serial Links", *Computer System Laboratory*, Stanford University, Apr. 1999, (4 pages).
Wu et al., "A 2Gb/s 256 * 256 CMOS Crossbar Switch Fabric Core Design using Pipelined MUX", *IEEE*, Jul. 2002, pp. II-568-II-571.
Wijetunga, "High-performance crossbar design for system-on-chip", *3$^{rd}$ IEEE International Workshop*, Jun. 2003, (6 pages).
Borgatti et al., "A Multi-Context 6.4Gb/s/Channel On-Chip Communication Network Using 0.18 μm Flash-EEPROM Switches and Elastic Interconnects", *IEEE International Solid-State Circuits Conference*, Sep. 2003, (3 pages).
Chi et al., "Decomposed Arbiters for Large Crossbars with Multi-Queue Input Buffers", IEEE International Conference on Computer Design, Oct. 14-16, 1991, pp. 233-238.
Delgado-Frias et al., "A VLSI Crossbar Switch with Wrapped Wave Front Arbitration", IEEE Transactions on Circuits and Systems, vol. 50, Issue 1, Jan. 2003, pp. 135-142.
Kavaldjiev et al., "A Virtual Channel Router for On-chip Networks", IEEE International SoC Conference, Sep. 12-15, 2004, pp. 289-293.
Shin et al, "Round-robin Arbiter Design and Generation", International Symposium on System Synthesis, 2002, pp. 243-248.
Molnar et al., "Simple Circuits that Work for Complicated Reasons", International Symposium on Advanced Research in Asynchronous Circuits and Systems, 2000, 12 pages.

(56) References Cited

OTHER PUBLICATIONS

Josephs et al., "CMOS Design of the Tree Arbiter Element", IEEE Transactions on VLSI systems, vol. 4, Issue 4, Dec. 1996, pp. 472-476.
UK Search Report dated Apr. 16, 2010 for GB 1000172.5.
Plummer, "Asynchronous Arbiters", IEEE Transactions on Computers Archive, vol. 21, Issue 1, Jan. 1972), pp. 37-42.
"NB9103112: Neural-Network Controller for Large Crosspoint Networks" Mar. 1, 1991, IBM, IBM Technical Disclosure Bulletin, vol. 33, Iss. 10B, pp. 112-116.
"NB9103106: Hierarchical Neural Network-Based Controller for Crosspoint Networks" Mar. 1, 1991, IBM, IBM Technical Disclosure Bulletin, vol. 33, Iss. 10B, pp. 106-109.
A. Marrakchi et al, "A Neural Net Arbitrator for Large Crossbar Packet-Switches" IEEE Transactions on Circuits and Systems, vol. 36, No. 7, Jul. 1989, pp. 1039-1041.
J. Ghosh et al, "Neural Networks for Fast Arbitration and Switching Noise Reduction in Large Crossbars" IEEE Transactions on Circuits and Systems, vol. 38, No. 8, Aug. 1991, pp. 895-904.
Notice of Allowance mailed Mar. 22, 2012 in co-pending U.S. Appl. No. 12/458,511.
D H Seo et al., "Table-lookup based Crossbar Arbitration for Miniman-Routed, 2D Mesh and Torus Networks", Parallel and Distributed Processing Symposium, (Mar. 2007), IPDPS 2007, IEEE International, pp. 1, 20, 26-30.
C. Minkenberg et al., "Reliable Control Protocol for Crossbar Arbitration", Communications Letters, IEEE, vol. 9, No. 2, (Feb. 2005), pp. 178, 180.
C. Minkenberg et al., "Low-latency pipelined crossbar arbitration", Global Telecommunications Conference, vol. 2, (Nov. 3,-Dec. 2004), pp. 1174, 1179.
Nitta, C. et al., "DCAF—A Directly Connected Arbitration-Free Photonic Crossbar for Energy-Efficient High Performance Computing", Parallel & Distributed Processing Symposium (IPDPS), 2012 IEEE $26^{th}$ International, (May 21-25, 2012).
Office Action mailed Feb. 28, 2014 in co-pending U.S. Appl. No. 13/438,920.

* cited by examiner

SINGLE CYCLE ARBITRATION WITHIN AN INTERCONNECT

This application is a continuation-in-part of U.S. patent application Ser. No. 13/438,920 filed 4 Apr. 2012, which is a continuation-in-part of U.S. patent application Ser. No. 12/926,462 filed 18 Nov. 2010, which is a continuation-in-part of U.S. patent application Ser. No 12/1458.511 filed 14 Jul. 2009, which is a continuation-in-part of U.S. application Ser. No. 12/379,191 filed 13 Feb. 2009, the contents of each of which are incorporated herein in their entirety by reference.

BACKGROUND

This invention relates to the field of data processing systems. More particularly, this invention relates to the field of interconnect circuitry for providing communication between a selected one of a plurality of signal inputs and a signal output by applying an arbitration policy.

It is known to provide interconnect circuitry for providing a communication path for data between a selected one of a plurality of signal inputs and a single output. Such multiplexing circuitry may apply an arbitration policy so that certain signal inputs are given priority in securing access to the signal output. A challenge within such interconnect circuitry is to reduce the time taken for the arbitration (thereby reducing the number of cycles taken for arbitration or permitting use of a higher clock frequency) while ensuring fairness between the signal inputs, e.g. where more than one parameter controls arbitration.

SUMMARY

Viewed from one aspect the present invention provides an interconnect circuitry for providing a communication path for data between a selected one of N signal inputs and a signal output, where N is an integer of two or more, said interconnect circuitry comprising:

multiplexing circuitry configured to select one of said N signal inputs as a selected signal input in dependence upon a selection signal and to connect said selected signal input to said signal output to send given data; and arbitration circuitry configured to generate said selection signal so as to perform an arbitration in a single cycle between a plurality of said N signal inputs having respective data to send, wherein said arbitration is performed in dependence upon:

(i) respective values of a first arbitration parameter associated with each of said plurality of said N signal inputs; and (ii) when two or more of said plurality of said N signal inputs have a common value of said first arbitration parameter, a second arbitration parameter associated with each of said two or more of plurality of said N signal inputs, said second arbitration parameter having a different value for each of said two or more of said plurality of said N signal inputs.

The present technique performs arbitration based upon a first arbitration parameter and a second arbitration parameter. When two or more of the signal inputs have a common value for the first arbitration parameter, then the second arbitration parameter is used to resolve between the signal inputs which otherwise have the same priority level, as the second arbitration parameter is arranged such that it has a different value for at least each of the two or more signal inputs which tie in their first arbitration parameter. In some embodiments the second arbitration parameter may be arranged to have a unique value for each signal input irrespective of whether or not any ties occur with the first arbitration parameter.

The plurality of signal inputs may be connected to respective data source circuits and the signal output may be coupled to a data destination circuit. The data source circuits and the destination circuits may be formed together with the interconnect circuitry on a single integrated circuit. Intra-circuit communication within an integrated circuit is a significant processing bottleneck as integrated circuits increase in the sophistication of their design and the number of different functional blocks provided within an integrated circuit, e.g. in system-on-chip integrated circuits.

While it will be appreciated that the present technique may be used in situations where there is only a single signal output, the present technique is well suited to embodiments in which there are a plurality of signal outputs, with access to each of the signal outputs being separately arbitrated in accordance with its own arbitration priorities (which may or may not be the same between different signal outputs). The number of inputs may be the same as the number of outputs providing a symmetrical arrangement, although other arrangements are possible where the number of inputs is different to the number of outputs.

The first arbitration parameter may be arranged to a have a value representing a quality of service level associated with data sent from a corresponding input. In this way, the arbitration using the first arbitration parameter may be arranged to provide access to the signal output in a manner which is matched to a desired quality of service level associated with respective signal inputs.

Various different forms of first arbitration parameter are possible, e.g. it would be possible to form a first arbitration parameter based upon the number of packets of data a given input has been able to send during a certain period. One form of first arbitration parameter that may be used to provide arbitration representing a quality of service level while fairly apportioning access to the signal output between the different signal inputs is one in which the first arbitration parameter is a time stamp value and the time stamp value for the selected signal input is updated when that selected signal input sends data. Associating a time stamp with each signal input when it sends data may be used as a way of assisting in fairly partitioning access to the signal output between a plurality of signal inputs. The time stamp may indicate when data was sent, or when the signal input concerned is expecting to next be able to send data, in accordance with its fair allocation of the bandwidth associated with the signal output.

Updating the time stamp value by a time increment value that varies in dependence upon a quality of service level associated with the selected signal input is a way of partitioning the available bandwidth of the signal output between the different signal inputs. The incremented time stamp value can represent when a given signal input can next fairly expect to have access to the signal output. A high priority signal input would have a small time increment applied so that it will relatively quickly re-qualify to be able to gain access to the signal output. Conversely, a low priority signal input will have a relatively large time increment applied such that a relatively long period will expire before it is eligible for access to the signal output. It will be appreciated that when there is no contention for access to the signal output, then any of the signal inputs which has data to send may be granted access to the signal output irrespective of its associated time stamp value.

The arbitration circuitry may be configured to compare time stamp values associated with the signal inputs which have data to send and are contending for access to the signal output. The arbitration circuit can eliminate from the possibility of selection as the selected signal input any of the plurality of inputs having data to send that has a higher time stamp value than one or more of the other of the plurality of signal inputs that have data to send. Thus, if a single signal input has the lowest time stamp value, then all the other signal inputs will be eliminated. The time stamps reflects the history of access. A low time stamp value indicates that an associated signal input has not received its fair share of access to the signal output relative to the other signal inputs. If two or more signal inputs share the lowest time stamp value, then all the other remaining signal inputs will be eliminated.

In order to address size constraints associated with the storage and manipulation of time stamp values and the eventual overflow of time stamp values, the arbitration circuitry may be configured such that when at least one of the time stamp values associated with one of the signal inputs reaches a threshold level, then all of the time stamp values are divided by two (right shifted by one bit position). While such an approach loses some resolution in the differentiation between the time stamp values that are stored, the coarse level relative ordering of the time stamp values, above the level of lost resolution, is maintained.

The second arbitration parameter associated with each of the signal inputs can have a variety of different forms providing that the second arbitration parameter values are different for at least those signal inputs which may share a common first arbitration parameter value. One such form of second arbitration parameter which provides fairness and guarantees a resolution to determining which signal input should be selected is one in which the second arbitration represents a relative order in which the signal inputs were previously selected to serve as the selected signal input. For example, the second arbitration parameter may represent the relative order in the form of a least recently granted (LRG) parameter with the signal that has the longest duration since it was previously granted access to the signal output having the highest priority second arbitration parameter. Other forms of second arbitration parameter may also be used, e.g. the second arbitration parameter may be allocated on the basis of a static priority, a round robin algorithm, etc.

The first arbitration parameter and the second arbitration parameter may be concatenated to form an at least logically combined arbitration parameter with the second arbitration parameter controlling a least significant bit portion of the combined arbitration parameter. Concatenating the two arbitration parameters in this way simplifies and speeds up their comparison whilst maintaining their relative significance, i.e. the hierarchy by which they act to control selection of a particular signal input as the selected signal input.

The comparison of the combined arbitration parameter may be speeded up when the arbitration circuitry comprises thermometer coding circuitry that serves to thermometer code the logically combined arbitration parameter to generate a thermometer coded arbitration parameter. Thermometer coded arbitration parameters are well suited to parallel comparison to one another in a manner in which the highest priority such thermometer coded arbitration parameter may be identified within a single cycle. The different portions of the combined arbitration parameter may in practice be stored in different structures, but act together to provide an overall thermometer coding.

The comparison circuitry used to perform the comparison between thermometer coded arbitration parameters may comprise a plurality of signal lines each pre-charged to a determined signal level with these signal lines then each being selectively discharged in dependence upon the thermometer coded arbitration parameters.

The plurality of signal lines which are selected to be discharged may be divided into groups such that, if there are N signal inputs between which a selection is to be made, then are $2^X$ groups of signal lines each associated with a different value of the first arbitration parameter, where X is the bit length of the first arbitration parameter, when this has been subject to thermometer coding. The comparison circuitry may be configured to discharge all the signal lines within a given group of signal lines if any of the N signal inputs has a first arbitration parameter indicative of a higher priority than a first arbitration parameter associated with that given group. Thus, a higher priority signal input will discharge the signal lines associated with lower priority signal inputs in a manner which represents the comparison of priority levels that it is desired to perform.

Each of the groups of signal lines may contain N signal lines with different signal lines within each group of signal lines corresponding to different respective unique values of the second arbitration parameter. The comparison circuitry may be configured to discharge the different signal lines within a threshold group, i.e. a group that is associated with a highest priority first arbitration parameter, in dependence upon the second arbitration parameter associated with the N signal inputs such that a single signal line within the threshold group will remain charged thereby identifying which of the N signal inputs is to be selected as the selected signal output. Thus, the first arbitration parameter may be considered to control the discharging of the groups as a whole which correspond to lower priority values of the first arbitration parameter, with discharge within the threshold group being performed in dependence upon the second arbitration parameter such that a single signal input may be selected in accordance with that second arbitration parameter if two or more signals share a value of the first arbitration parameter.

The signal lines which are used to provide the above described arbitration may be conveniently reused to also communicate the data between the signal inputs and the signal output once the arbitration has resolved.

Viewed from another aspect the present invention provides interconnect circuitry for providing a communication path for data between a selected one of N signal inputs and a signal output, where N is an integer of two or more, said interconnect circuitry comprising:

multiplexing means for selecting one of said N signal inputs as a selected signal input in dependence upon a selection signal and to connect said selected signal input to said signal output to send given data; and arbitration means for generating said selection signal so as to perform an arbitration in a single cycle between a plurality of said N signal inputs having respective data to send, wherein said arbitration is performed in dependence upon:

(i) respective values of a first arbitration parameter associated with each of said plurality of said N signal inputs; and (ii) when two or more of said plurality of said N signal inputs have a common value of said first arbitration parameter, a second arbitration parameter associated with each of said two or more of plurality of said N signal inputs, said second arbitration parameter having a different value for each of said two or more of said plurality of said N signal inputs.

Viewed from another aspect the present invention provides a method of providing a communication path for data between a selected one of N signal inputs and a signal output, where N is an integer of two or more, said method comprising the steps of:

selecting one of said N signal inputs as a selected signal input in dependence upon a selection signal and to connect said selected signal input to said signal output to send given data; and generating said selection signal so as to perform an arbitration in a single cycle between a plurality of said N signal inputs having respective data to send, wherein said arbitration is performed in dependence upon:

(i) respective values of a first arbitration parameter associated with each of said plurality of said N signal inputs; and
(ii) when two or more of said plurality of said N signal inputs have a common value of said first arbitration parameter, a second arbitration parameter associated with each of said two or more of plurality of said N signal inputs, said second arbitration parameter having a different value for each of said two or more of said plurality of said N signal inputs.

The above, and other objects, features and advantages of this invention will be apparent from the following detailed description of illustrative embodiments which is to be read in connection with the accompanying drawings.

DESCRIPTION OF EXAMPLE EMBODIMENTS

Figure 1:
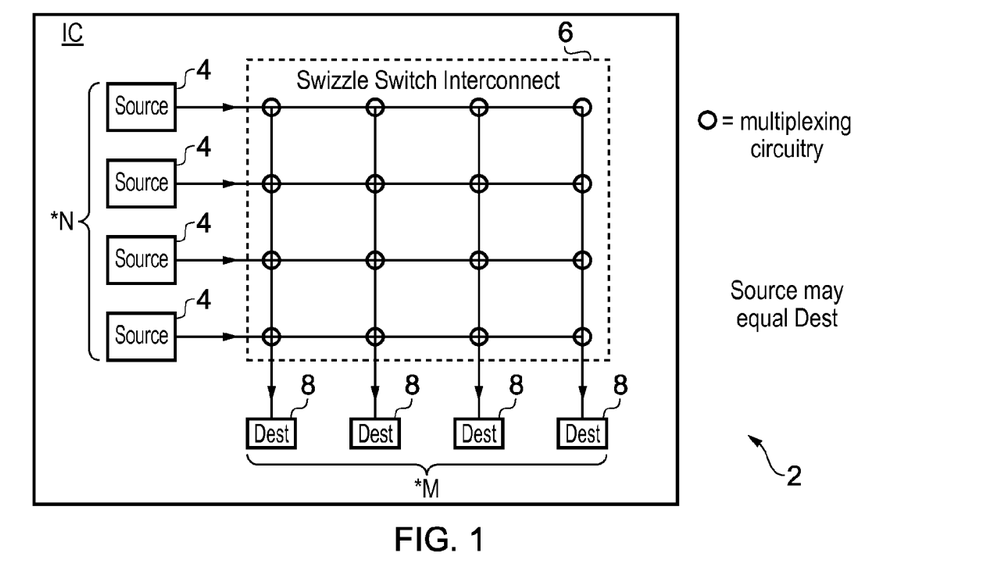
FIG. 1 schematically illustrates an integrated circuit including a swizzle switch interconnect connecting a plurality of data source circuits to a plurality of data destination circuits.

FIG. 1 schematically illustrates an integrated circuit 2 including a plurality of data source circuits 4 connected via interconnect circuitry 6 to a plurality of data destination circuits 8. The form of the interconnect circuitry 6 may be that of a swizzle switch interconnect as described in co-pending U.S. patent application Ser. No. 13/438,920 the content of which is incorporated herein in its entirety by reference.

The swizzle switch interconnect 6 provides the ability to connect any of the data source circuits 4 to any of the data destination circuits 8. In this example, there are four data source circuits 4 and the same number of data destination circuits 8. However, these numbers could be different. Also, it will be appreciated that the data source circuits 4 and the data destination circuits 8 are illustrated as distinct entities, whereas in practice one or more of these may be a common entity, e.g. a general purpose processor connected to the interconnect circuitry 6 may serve as both a data source and a data destination.

As described in the above referenced co-pending application, the interconnect circuitry 6 is provided with signal lines which may be precharged and then selectively discharged to perform the tasks of arbitrating between the sources and destinations as well as, in a subsequent cycle, transferring data values between the sources and the destinations. Any of the data source circuits 4 may be connected to any of the data destination circuits 8 and accordingly at the intersections illustrated in FIG. 1 there is provided multiplexing circuitry. A column of the multiplexing circuitry indicated in FIG. 2 serves to select one of the N data source circuits 4 for connection to the data destination circuit 8 at the foot of that column The arbitration circuitry, which is present within the interconnect circuitry 6, is provided in layers below the layers which provide the signal lines which are precharged and then selectively discharged. Thus, while the figures herein show the arbitration circuitry and the wires (signal lines) side-by-side, in practice the arbitration circuitry will be in a layer of an integrated circuit below the metal layer providing the wires and so will not consume any additional circuit area. This arbitration circuitry will be described later.

Figure 2:
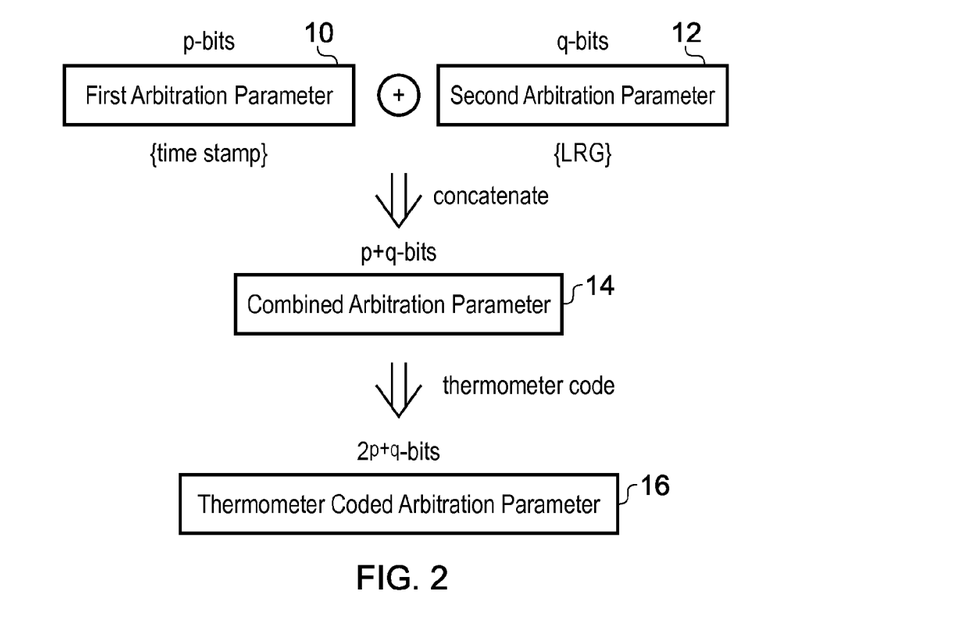
FIG. 2 schematically illustrates a first arbitration parameter and a second arbitration parameter being concatenated to form a combined arbitration parameter, which is itself then subject to thermometer coding to form a thermometer coded arbitration parameter.

FIG. 2 schematically illustrates a p-bit first arbitration parameter 10 and a q-bit second arbitration parameter 12. The first arbitration parameter 10 may take the form of a time stamp value allocated in accordance with a virtual clock value which is maintained and updated in respect of the arbitration performed for each of the signal outputs, and which is sampled and associated with respective signal inputs triggered by those signal inputs being permitted to send a data value to the signal output. The second arbitration parameter 12 may be in the form of a value representing which of the signal inputs has least recently been granted access to the signal output. Thus, each time one of the signal inputs is granted access, then all of the least recently granted values associated with the other signal inputs are updated to reflect the new relative ordering. Use of such a second arbitration parameter representing least recently granted status provides a second arbitration parameter in which each of the signal inputs has a different second arbitration parameter value. This ensures that the second arbitration parameter value can be used to resolve arbitration between signal inputs when those signal inputs share a first arbitration parameter value.

As illustrated in FIG. 2, the first arbitration parameter 10 and the second arbitration parameter 12 may be concatenated to perform a combined arbitration parameter 14 with the second arbitration parameter forming the least significant portion of this combined arbitration parameter 14. Combining the first arbitration parameter 10 and the second arbitration parameter 12 in this way ensures that the second arbitration parameter 12 will only be effective in discriminating between priority levels when the higher order bit portion corresponding to highest current value of the first arbitration parameter 10 is common to two or more different signal inputs.

In order to speed up the comparison between arbitration parameter values, the combined arbitration parameter value 14 is subject to thermometer coding to produce a thermometer coded arbitration parameter 16 that has $2^{p \pm q}$. Such thermometer coded arbitration parameter values are better suited to parallel comparison in a single cycle permitting rapid determination of which signal input is to be given access to the signal output.

Figure 3:
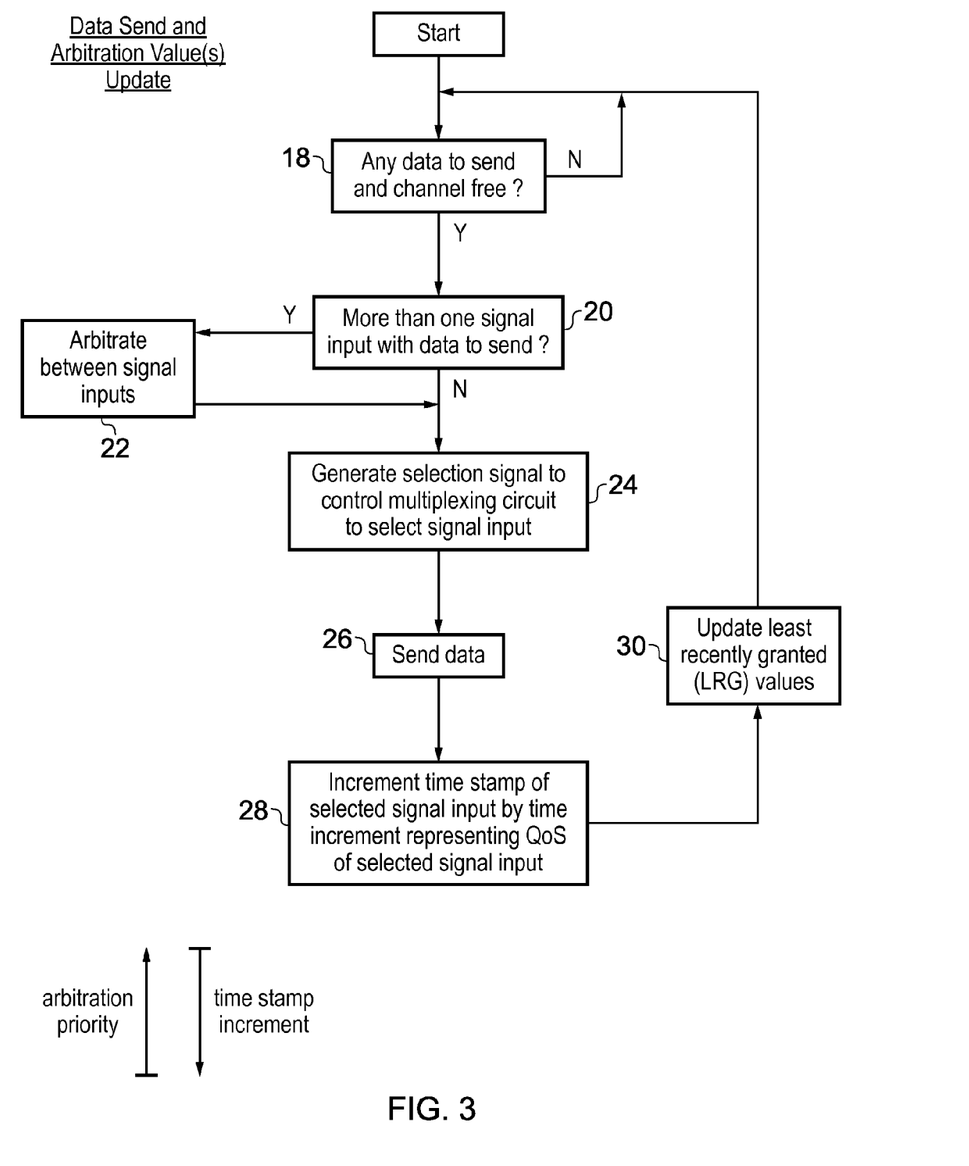
FIG. 3 is a flow diagram schematically illustrating selecting which data to send and updating the arbitration values.

FIG. 3 is a flow diagram schematically illustrating the control applied to the sending of data and the updating of arbitration values. At step 18 processing waits until at least one of the signal inputs has a data value to be communicated to the signal output and the data channel provided by the swizzle switch interconnect is free (available). Step 20 determines whether there are more than one signal input with data ready to send. If there are more than one signal input with data ready to send, then step 22 performs arbitration (described below) between these signal inputs to select a single one as the selected signal input which is to be permitted to send its data. At step 24 a selection signal is generated for the selected signal input which controls the multiplexing circuitry illustrated in FIG. 1 to select the signal input and permit it to pass its data value (or burst of data values if this is permitted by a particular embodiment) to the signal data output. This transfer of data is performed at step 26. At step 28 the time stamp of the selected signal input is incremented by a time increment which represents a quality of service level associated with the selected signal input. A signal input with a high quality of service level (a high level of bandwidth to be allocated to it) is associated with a relatively small time stamp increment. Conversely, a signal input with a relatively low priority and low quality of service level (corresponding to relatively low bandwidth allocation) has a relatively high time stamp increment applied to it. When comparing the time stamp values associated with the signal inputs, then the lowest time stamp value is given priority. The time stamp value associated with a single input can be considered as representing the time at which that signal can reasonably expect to be given access to the signal output given its priority level and allocation of the bandwidth when there is contention between signal inputs for access to the signal output. If there is no contention, then any signal input of a data to send can send that data and update its time stamp value. When two or more signal inputs have data to send, then the time stamp values of those signal inputs serve as the first arbitration parameter and may be compared to determine which of those signal inputs should be given access to the signal output.

Following the increment to the time stamp applied in step 28, processing proceeds to step 30 where the least recently granted values associated with each of the signal inputs are updated to reflect the granting to the signal input, which was selected by the selection signal at step 24, access to the signal output. All of the least recently granted values will be updated to reflect the new relative ordering in which they have been granted access to the signal output. The least recently granted values serve as the second arbitration parameter and are all different.

Figure 4:
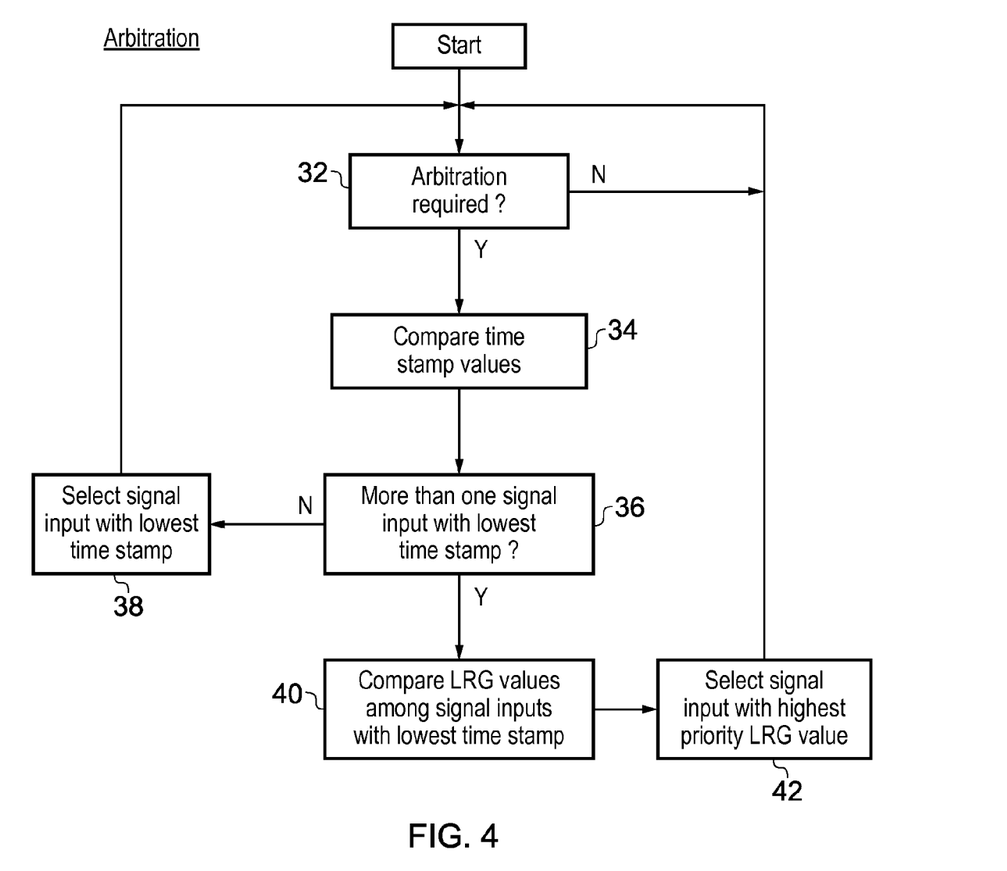
FIG. 4 is a flow diagram schematically illustrating arbitration.

FIG. 4 is a flow diagram schematically illustrating the arbitration performed at step 22. Step 32 waits until arbitration is required. Step 34 then compares time stamp values. Step 36 determines if there is more than one signal input with the lowest time stamp value. If the determination at step 36 is that there is only one signal input with the lowest time stamp value, then this signal input is selected at step 38 and processing returns to step 32. If the determination at step 36 is that there is more than one signal input with the lowest time stamp value, then processing proceeds to step 40 where the least recently granted values associated with those signal inputs with the lowest time stamp values are compared. Thus, the second arbitration parameter takes effect when signal inputs share a common value for the first arbitration parameter (lowest time stamp value). Step 42 selects for communication with the signal output during this single cycle evaluation the signal input with the highest priority least recently granted value. The least recently granted value with the highest priority is that which indicates that the signal input concerned has not been granted access to the signal output for the longest time.

Figure 5:
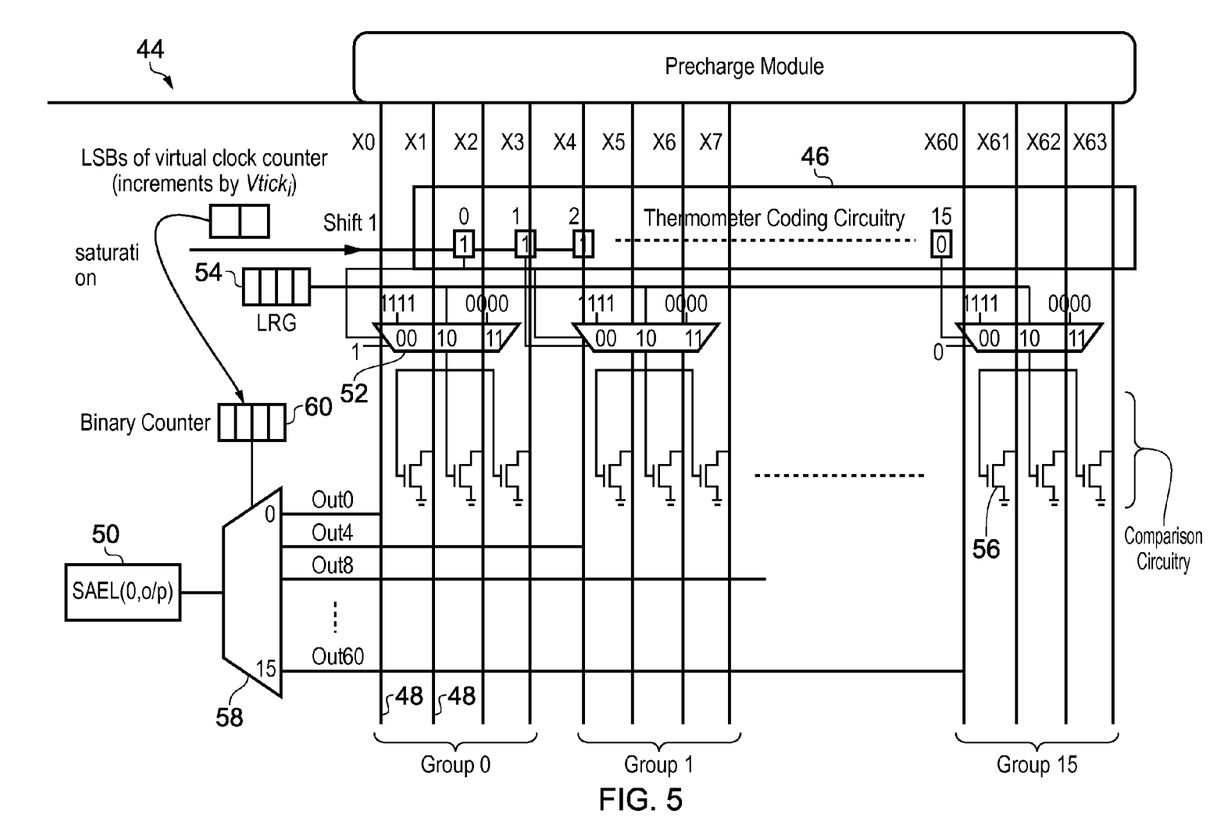
FIG. 5 schematically illustrates arbitration circuitry provided in the form of signal lines which are precharged and then selectively discharged in dependence upon a first arbitration parameter and a second arbitration parameter.

FIG. 5 schematically illustrates arbitration circuitry 44 for controlling access to one of the signal outputs of the interconnect circuitry 6 illustrated in FIG. 1. The most significant bits of a virtual clock count value serve as a first arbitration parameter and are subject to thermometer coding by thermometer coding circuitry 46 to produce a thermometer coded value having one bit position associated with a respective group of signal lines 48 passing through the interconnect 6. The sense amplifier enable latch 50, which is driven by the portion of the arbitration circuitry 44 illustrated in FIG. 5, when active serves to select signal input 0 to have access to the signal output when the first arbitration value and the second arbitration value are associated with signal input 0 win the arbitration as they have the highest priority (associated with their quality of service). The thermometer coded arbitration value generated by the thermometer coding circuitry 46 is the arbitration parameter associated with signal input 0 at that point in time. A first portion of this arbitration parameter value is shown as comprising bits (0) to (15) in FIG. 5 with each of these bits controlling switching of a multiplexer 52 that either discharges none of the signal lines 48 within a group, all of the signal lines 48 within a group or some of the signal lines in dependence upon a second arbitration parameter given by a thermometer coded least significant portion representing the least recently granted value and stored within register 54.

As illustrated in FIG. 5 when the time stamp value reaches a level at which it is close to saturation, or at least one of the time stamp values is close to saturation, then a right shift by half its bit length is applied to the thermometer coded arbitration values stored within the thermometer coding circuitry 46, the register 60 and also the least significant bits of the virtual clock counter. The comparison circuitry is provided by gates 56 which selectively discharge the precharged signal lines in dependence upon the thermometer coded arbitration value. It will be appreciated that FIG. 5 illustrates the selective discharge of the signal lines 48 in respect of a single signal input, but in practice selected discharge of the same signal lines 48 is also performed in respect of the other signal inputs, which will have their own thermometer coded arbitration values. The overall effect is that the comparison circuitry 56 for a given signal input will discharge the groups of signal lines associated with arbitration values of lower priority, and will not discharge the groups of signal lines 48 associated with arbitration values of a higher priority. If two signal inputs have arbitration values that share a first arbitration value parameter, then the boundary between the groups of signal lines which are discharged and not discharged will be the same for those two signal inputs. Accordingly, the partial discharge of signal lines performed by the multiplexer 52 within the group of signal lines at the boundary between the "1" bits and the "0" bits within the thermometer coded arbitration value will selectively discharge those lines in accordance with their own individual least recently granted values (second arbitration parameter values) and accordingly a comparison will be made between these least recently granted values such that the signal input with the highest priority least recently granted value will be identified. The multiplexer 58, which is controlled by the first arbitration parameter in binary form stored within register 60, serves to select one of the groups of signal lines which will indicate for that signal input with a given second arbitration parameter value whether or not that signal input is determined as winning any arbitration. The inputs to the multiplexer 58 for the signal input illustrated are connected to signal lines 0, 4, 8, . . . 60. The inputs to the multiplexer 58 for the next signal input, namely signal input 1, will correspond and will be taken from signal lines 1, 5, 9, . . . 61.

At an overall level, the arbitration circuitry 44 provides a single cycle arbitration using both a first arbitration parameter value corresponding to a time stamp value (which is subject to a time increment upon grant in dependent upon associated quality of service level) as well as a second arbitration parameter value (LRG value) provided for the purposes of a tie break resolution in the same cycle that the first arbitration parameter values are compared. The precharging and selective discharging of the signal lines 48 provides a mechanism supporting parallel comparison of multiple such arbitration parameter values within a single cycle.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. Interconnect circuitry for providing a communication path for data between a selected one of N signal inputs and a signal output, where N is an integer of two or more, said interconnect circuitry comprising:
   multiplexing circuitry configured to select one of said N signal inputs as a selected signal input in dependence upon a selection signal and to connect said selected signal input to said signal output to send given data; and
   arbitration circuitry configured to generate said selection signal so as to perform an arbitration in a single cycle between a plurality of said N signal inputs having respective data to send, wherein
   said arbitration is performed in dependence upon:
   (i) respective values of a first arbitration parameter associated with each of said plurality of said N signal inputs; and
   (ii) when two or more of said plurality of said N signal inputs have a common value of said first arbitration parameter, a second arbitration parameter associated with each of said two or more of plurality of said N signal inputs, said second arbitration parameter having a different value for each of said two or more of said plurality of said N signal inputs.

2. Interconnect circuitry as claimed in claim 1, wherein said N signal inputs are coupled to respective data source circuits and said signal output is coupled to a data destination circuit, said interconnect circuitry, said data source circuits and said data destination circuit all formed on a single integrated circuit.

3. Interconnect circuitry as claimed in claim 1, comprising M signal outputs, where M is an integer of one or more.

4. Interconnect circuitry as claimed in claim 1, wherein first arbitration parameter has a value representing a quality of service level associated with data sent from a corresponding signal input.

5. Interconnect circuitry as claimed in claim 1, wherein said second arbitration parameter is allocated to each of said N signal inputs to represent a relative order in which said N signal inputs were previously selected as said selected signal input.

6. Interconnect circuitry as claimed in claim 1, wherein said first arbitration parameter and said second arbitration parameter are concatenated to form a combined arbitration parameter with said second arbitration parameter controlling a least significant bit portion of said combined arbitration parameter.

7. Interconnect circuitry as claimed in claim 3, wherein M=N.

8. Interconnect circuitry as claimed in claim 4, wherein said first arbitration parameter is a time stamp value and said time stamp value for said selected signal input is updated when said selected signal input sends data.

9. Interconnect circuitry as claimed in claim 6, wherein said arbitration circuitry comprises thermometer coding circuitry configured to thermometer code said combined arbitration parameter of each of said N signal inputs to generate respective thermometer coded arbitration parameters.

10. Interconnect circuitry as claimed in claim 8, wherein said time stamp value for said selected input is updated by adding a time increment value to said time stamp value for said selected input, said time increment value varying in dependence upon a quality of service level associated with said selected signal input.

11. Interconnect circuitry as claimed in claim 9, wherein said arbitration circuitry comprises comparison circuitry configured to compare said thermometer coded arbitration parameters to identify which of said N signal inputs is selected as said selected signal input.

12. Interconnect circuitry as claimed in claim 10, wherein said arbitration circuitry is configured to compare time stamp values of a plurality of signal inputs having data to send and to eliminate from selection as said selected signal input any of said plurality of inputs having data to send that have a higher time stamp value that one or more other of said plurality of signal inputs having data to send.

13. Interconnect circuitry as claimed in claim 11, wherein said comparison circuitry comprises a plurality of signal lines each precharged to predetermined signal level and selectively discharged in dependence upon said thermometer coded arbitration parameters.

14. Interconnect circuitry as claimed in claim 12, wherein as said time increment value associated with a given signal input increases, a relative priority for access to said signal output by said given signal input among said N signal inputs decreases.

15. Interconnect circuitry as claimed in claim 13, wherein said plurality of signal lines is divided into $2^X$ groups of signal lines each associated with a different value of said first arbitration parameter, where X is the bit length of said first arbitration parameter, said comparison circuitry configured to discharge all signal lines within a given group of signal lines if any of N signal inputs has a first arbitration parameter indicative of a higher priority than a first arbitration parameter of said given group.

16. Interconnect circuitry as claimed in claim 8, wherein said arbitration circuitry is configured such that when at least one of said time stamp values associated with said N signal inputs reaches a threshold level, then all of said time stamp values are divided by two.

17. Interconnect circuitry as claimed in claim 13, wherein said signal lines are also used to communicate said data.

18. Interconnect circuitry as claimed in claim 15, wherein each group of signal lines contains N signal lines with different signal lines within each group of signal lines corresponding to different values of said second arbitration parameter, said comparison circuitry configured to discharge said different signal lines within a threshold group associated with a highest priority first arbitration parameter in dependence upon respective unique values of said second arbitration parameter associated with said N signal inputs such that a single signal line within said threshold group remains charged thereby identifying which of said N signal inputs is to be selected as said selected signal input.

19. Interconnect circuitry for providing a communication path for data between a selected one of N signal inputs and a signal output, where N is an integer of two or more, said interconnect circuitry comprising:
  multiplexing means for selecting one of said N signal inputs as a selected signal input in dependence upon a selection signal and to connect said selected signal input to said signal output to send given data; and
  arbitration means for generating said selection signal so as to perform an arbitration in a single cycle between a plurality of said N signal inputs having respective data to send, wherein
  said arbitration is performed in dependence upon:
  (i) respective values of a first arbitration parameter associated with each of said plurality of said N signal inputs; and
  (ii) when two or more of said plurality of said N signal inputs have a common value of said first arbitration parameter, a second arbitration parameter associated with each of said two or more of plurality of said N signal inputs, said second arbitration parameter having a different value for each of said two or more of said plurality of said N signal inputs.

20. A method of providing a communication path for data between a selected one of N signal inputs and a signal output, where N is an integer of two or more, said method comprising the steps of:
  selecting one of said N signal inputs as a selected signal input in dependence upon a selection signal and to connect said selected signal input to said signal output to send given data; and
  generating said selection signal so as to perform an arbitration in a single cycle between a plurality of said N signal inputs having respective data to send, wherein
  said arbitration is performed in dependence upon:
  (i) respective values of a first arbitration parameter associated with each of said plurality of said N signal inputs; and
  (ii) when two or more of said plurality of said N signal inputs have a common value of said first arbitration parameter, a second arbitration parameter associated with each of said two or more of plurality of said N signal inputs, said second arbitration parameter having a different value for each of said two or more of said plurality of said N signal inputs.

* * * * *